United States Patent
Park et al.

(10) Patent No.: US 12,469,433 B2
(45) Date of Patent: Nov. 11, 2025

(54) DISPLAY APPARATUS

(71) Applicant: Samsung Display Co., Ltd., Yongin-si (KR)

(72) Inventors: Junhyun Park, Yongin-si (KR);
Hyeongseok Kim, Yongin-si (KR);
Heejean Park, Yongin-si (KR);
Sunhwa Lee, Yongin-si (KR);
Mukyung Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/610,106

(22) Filed: Mar. 19, 2024

(65) Prior Publication Data

US 2024/0321183 A1  Sep. 26, 2024

(30) Foreign Application Priority Data

Mar. 24, 2023 (KR) .................. 10-2023-0039094
May 18, 2023 (KR) .................. 10-2023-0064556

(51) Int. Cl.
*G09G 3/32* (2016.01)

(52) U.S. Cl.
CPC ....... *G09G 3/32* (2013.01); *G09G 2300/0426* (2013.01); *G09G 2300/0842* (2013.01); *G09G 2310/0267* (2013.01); *G09G 2320/0247* (2013.01)

(58) Field of Classification Search
CPC ... G09G 2300/0426; G09G 2300/0404; G09G 2310/0286; G09G 2320/0223
See application file for complete search history.

(56) References Cited

U.S. PATENT DOCUMENTS

| | | |
|---|---|---|
| 8,913,090 B2 | 12/2014 | Chung et al. |
| 9,293,090 B2 | 3/2016 | Jung et al. |
| 9,406,271 B2 | 8/2016 | Yoon et al. |
| 9,735,143 B2 | 8/2017 | Kim et al. |
| 10,312,305 B2 * | 6/2019 | Kim .............. H10K 50/805 |
| 10,312,469 B2 * | 6/2019 | Park ............. H10K 59/122 |
| 2019/0140212 A1 * | 5/2019 | Park ............ H10K 50/8426 |
| 2019/0288046 A1 * | 9/2019 | Park ............. H10K 59/124 |
| 2019/0333461 A1 * | 10/2019 | Kikuchi ......... H01L 29/7869 |
| 2020/0105849 A1 | 4/2020 | Kim et al. |
| 2021/0242300 A1 | 8/2021 | Kwak et al. |
| 2022/0101777 A1 | 3/2022 | Kim et al. |
| 2022/0140037 A1 | 5/2022 | Park et al. |

FOREIGN PATENT DOCUMENTS

| | | |
|---|---|---|
| KR | 10-2007-0024892 A | 3/2007 |
| KR | 10-2010-0100213 A | 9/2010 |
| KR | 10-2011-0064583 A | 6/2011 |

(Continued)

*Primary Examiner* — Van N Chow
(74) *Attorney, Agent, or Firm* — Womble Bond Dickinson (US) LLP

(57) ABSTRACT

A display apparatus includes: a plurality of light-emitting diodes in a display area; a gate driver in a non-display area around the display area, the gate driver including a plurality of stages; a conductive line in the non-display area; an insulating layer on the conductive line; and a connection line on the insulating layer and electrically connecting the conductive line with a transistor of a first stage from among the plurality of stages.

16 Claims, 11 Drawing Sheets

(56) References Cited

FOREIGN PATENT DOCUMENTS

| KR | 10-1127582 B1   | 3/2012 |
| KR | 10-2016-0092592 A | 8/2016 |
| KR | 10-2020-0016425 A | 2/2020 |
| KR | 10-2020-0037027 A | 4/2020 |
| KR | 10-2022-0042029 A | 4/2022 |
| KR | 10-2022-0058714 A | 5/2022 |

* cited by examiner

DISPLAY APPARATUS

CROSS-REFERENCE TO RELATED APPLICATIONS

The present application claims priority to and the benefit of Korean Patent Application No. 10-2023-0039094, filed on Mar. 24, 2023, and Korean Patent Application No, 10-2023-0064556, filed on May 18, 2023, in the Korean Intellectual Property Office, the entire disclosure of each of which is incorporated herein by reference.

BACKGROUND

1. Field

Aspects of one or more embodiments relate to a display apparatus.

2. Description of Related Art

Recently, the various uses and applications for display apparatuses has diversified. Also, as the range of uses of display apparatuses has increased, the demand for high-resolution display apparatuses has increased. To manufacture high-resolution display apparatuses, various types of processes may be performed.

The above information disclosed in this Background section is only for enhancement of understanding of the background and therefore the information discussed in this Background section does not necessarily constitute prior art.

SUMMARY

Of a manufacturing process of a display apparatus, in an etching process, etc. using plasma, static electricity may unintentionally damage components of the display apparatus or degrade the performance thereof. One or more embodiments include a high-quality display apparatus. The objectives described above are examples, and the objectives to be achieved by the disclosure are not limited thereto.

Additional aspects will be set forth in part in the description which follows and, in part, will be apparent from the description, or may be learned by practice of the presented embodiments of the disclosure.

According to one or more embodiments, a display apparatus includes a plurality of light-emitting diodes arranged in a display area, a gate driver arranged in a non-display area around the display area, the gate driver including a plurality of stages, a conductive line arranged in the non-display area, an insulating layer arranged on the conductive line, and a connection line arranged on the insulating layer and electrically connecting the conductive line with a transistor included in a first stage from among the plurality of stages.

According to some embodiments, the transistor may include a semiconductor layer, a gate electrode layer on the semiconductor layer, and a gate insulating layer between the semiconductor layer and the gate electrode layer.

According to some embodiments, the display apparatus may further include an interlayer insulating layer interposed between the gate insulating layer and the insulating layer. A first portion of the connection line may be electrically connected to the conductive line through a first contact hole passing through the insulating layer, and a second portion of the connection line may be electrically connected to the transistor through a second contact hole passing through the insulating layer and the interlayer insulating layer.

According to some embodiments, the second portion of the connection line may be in direct contact with the semiconductor layer or the gate electrode layer through the second contact hole.

According to some embodiments, the conductive line may include at least one metal selected from Al, Cu, and Ti.

According to some embodiments, a portion of the connection line may extend in a direction which is the same as an extension direction of the conductive line.

According to some embodiments, the conductive line may include a first conductive part and a second conductive part spaced apart from each other in the extension direction of the conductive line, and the connection line may be electrically connected to each of the first conductive part and the second conductive part.

According to some embodiments, the display apparatus may further include a sub-pixel circuit arranged in the display area and including transistors electrically connected to a first light-emitting diode from among the plurality of light-emitting diodes, and the first stage may be configured to provide a gate signal to a gate electrode of any one transistor from among the transistors of the sub-pixel circuit.

According to some embodiments, the display apparatus may further include a gate line arranged in the display area and electrically connected to the gate electrode of the any one transistor of the sub-pixel circuit, and the conductive line may include a same material as the gate line.

According to some embodiments, the gate line may be arranged on a different layer from the gate electrode of the any one transistor of the sub-pixel circuit.

According to some embodiments, the sub-pixel circuit may further include a storage capacitor including a lower electrode and an upper electrode overlapping each other, and the conductive line may include a same material as the upper electrode of the storage capacitor.

According to one or more embodiments, a display apparatus includes a light-emitting diode arranged in a display area, a sub-pixel circuit electrically connected to the light-emitting diode and including a silicon-based transistor, an oxide-based transistor, and a storage capacitor, a gate driver arranged in a non-display area around the display area, the gate driver including a plurality of stages, a conductive line arranged in the non-display area, an insulating layer arranged on the conductive line, and a connection line arranged on the insulating layer and electrically connecting the conductive line with a transistor included in a first stage from among the plurality of stages.

According to some embodiments, the first stage may be configured to provide a gate signal to the silicon-based transistor or the oxide-based transistor of the sub-pixel circuit.

According to some embodiments, the transistor may include a semiconductor layer, a gate electrode layer on the semiconductor layer, and a gate insulating layer between the semiconductor layer and the gate electrode layer.

According to some embodiments, the display apparatus may further include an interlayer insulating layer interposed between the gate insulating layer and the insulating layer. A first portion of the connection line may be electrically connected to the conductive line through a first contact hole passing through the insulating layer, and a second portion of the connection line may be electrically connected to the transistor through a second contact hole passing through the insulating layer and the interlayer insulating layer.

According to some embodiments, the second portion of the connection line may be in direct contact with the semiconductor layer or the gate electrode layer through the second contact hole.

According to some embodiments, the conductive line may include a same material as a gate line electrically connected to the silicon-based transistor or the oxide-based transistor of the sub-pixel circuit.

According to some embodiments, the storage capacitor may include a lower electrode and an upper electrode overlapping each other, and the conductive line includes a same material as the upper electrode.

According to some embodiments, a portion of the connection line may extend in a direction which is the same as an extension direction of the conductive line.

According to some embodiments, the conductive line may include a first conductive part and a second conductive part spaced apart from each other in an extension direction of the conductive line, and the connection line may be electrically connected to each of the first conductive part and the second conductive part.

BRIEF DESCRIPTION OF THE DRAWINGS

The above and other aspects, features, and characteristics of certain embodiments of the present disclosure will be more apparent from the following description taken in conjunction with the accompanying drawings, in which.

DETAILED DESCRIPTION

Figure 1:
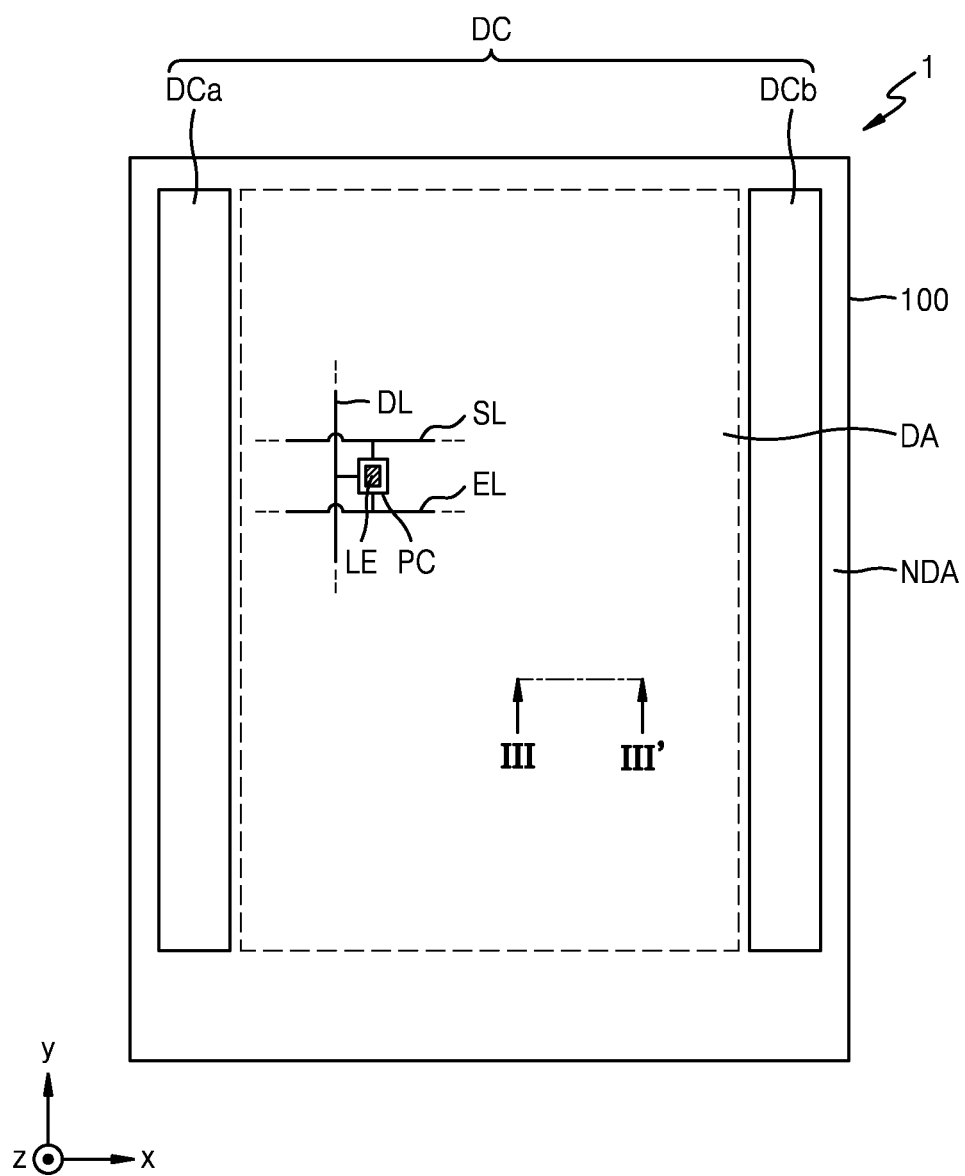
FIG. 1 is a schematic plan view of a display apparatus according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" or "at least one selected from a, b and c" indicates only a, only b, only c, both a and b, both a and c, both b and c, all of a, b, and c, or any combination or variation thereof.

While the disclosure is capable of various modifications and alternative forms, embodiments thereof are shown by way of example in the drawings and will herein be described in detail. Effects and characteristics of the disclosure, and realizing methods thereof will become apparent by referring to the drawings and embodiments described in detail below. However, embodiments according to the present disclosure are not limited to the embodiments disclosed hereinafter and may be realized in various forms.

Hereinafter, aspects of some embodiments of the present disclosure will be described in detail by referring to the accompanying drawings. In descriptions with reference to the drawings, the same reference numerals are given to elements that are the same or substantially the same and descriptions may not be repeated.

It will be understood that although the terms "first," "second," etc. may be used herein to describe various components, these components should not be limited by these terms. These components are only used to distinguish one component from another.

As used herein, the singular expressions "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or element is referred to as being formed "on" another layer, area, or element, it can be directly or indirectly formed on the other layer, region, or element. That is, for example, intervening layers, regions, or elements may be present.

Sizes of elements in the drawings may be exaggerated for convenience of explanation. For example, sizes and thicknesses of the elements in the drawings are randomly indicated for convenience of explanation, and thus, the embodiments according to the present disclosure are not necessarily limited to the illustrations of the drawings.

When a certain embodiment may be implemented differently, a specific process order may be performed differently from the described order. For example, two consecutively described processes may be performed substantially at the same time or performed in an order opposite to the described order.

In the embodiments hereinafter, it will be understood that when an element, an area, or a layer is referred to as being connected to another element, area, or layer, it can be directly or indirectly connected to the other element, area, or layer. For example, it will be understood in this specification that when an element, an area, or a layer is referred to as being in contact with or being electrically connected to another element, area, or layer, it can be directly or indirectly in contact with or electrically connected to the other element, area, or layer.

FIG. 1 is a schematic plan view of a display apparatus 1 according to some embodiments.

Referring to FIG. 1, the display apparatus 1 may include a display area DA and a non-display area NDA. The display area DA may be configured to display images by using light emitted from each of light-emitting diodes LE. The non-display area NDA may be arranged at an outer portion (e.g., in a periphery or outside a footprint) of the display area DA and may not display images. According to some embodiments, the non-display area NDA may totally surround the display area DA.

The light-emitting diode LE may include an organic light-emitting diode including an organic emission layer. Alternatively, the light-emitting diode LE may include a light-emitting diode including an inorganic emission layer. A size of the light-emitting diode may be micron-scale or nano-scale. For example, the light-emitting diode may include a micro-light-emitting diode. Alternatively, the light-emitting diode may include a nanorod-light-emitting diode. The nanorod-light-emitting diode may include GaN. According to some embodiments, a color conversion layer may be arranged on the nanorod-light-emitting diode. The color conversion layer may include quantum dots. Alternatively, the light-emitting diode LE may include a quantum dot light-emitting diode including a quantum dot emission layer.

A sub-pixel circuit PC electrically connected to each light-emitting diode LE may be configured to control the light-emitting diode LE. The plurality of sub-pixel circuits PC may be two-dimensionally arranged in the display area DA. Each sub-pixel circuit PC may include transistors and at least one storage capacitor. According to some embodiments, each sub-pixel circuit PC may be connected to a scan line SL and a data line DL. According to some embodiments, each sub-pixel circuit PC may be connected to the scan line SL, the emission control line EL, and a data line DL.

The scan line SL and/or the emission control line EL may extend in a first direction (e.g., an x direction) in the display area DA. The scan line SL and/or the emission control line EL may be connected to a gate driver DC. The gate driver DC may include a scan driver configured to provide a scan signal to the scan line SL and/or an emission control driver configured to provide an emission control signal to the emission control line EL. In other words, the scan line SL and/or the emission control line EL may be configured to receive the scan signal and/or the emission control signal from the gate driver DC and transmit the scan signal and/or the emission control signal to the sub-pixel circuit PC.

The gate driver DC may be arranged in the non-display area NDA. The gate driver DC may be arranged at opposite sides of the display apparatus 1 with the display area DA therebetween as illustrated in FIG. 1. For example, a first gate driver DCa and a second gate driver DCb may be arranged at opposite sides of the display area DA within the non-display area NDA. According to some embodiments, the gate driver DC may be arranged at a side of the display area DA. According to some embodiments, any one of the first gate driver DCa and the second gate driver DCb may be omitted.

The data line DL may extend in a second direction (e.g., a y direction) in the display area DA. The data line DL may be connected to a data driver. The data line DL may be connected to the sub-pixel circuit PC. The data line DL may be configured to receive a data signal from the data driver and transmit the data signal to the sub-pixel circuit PC.

Figure 2:
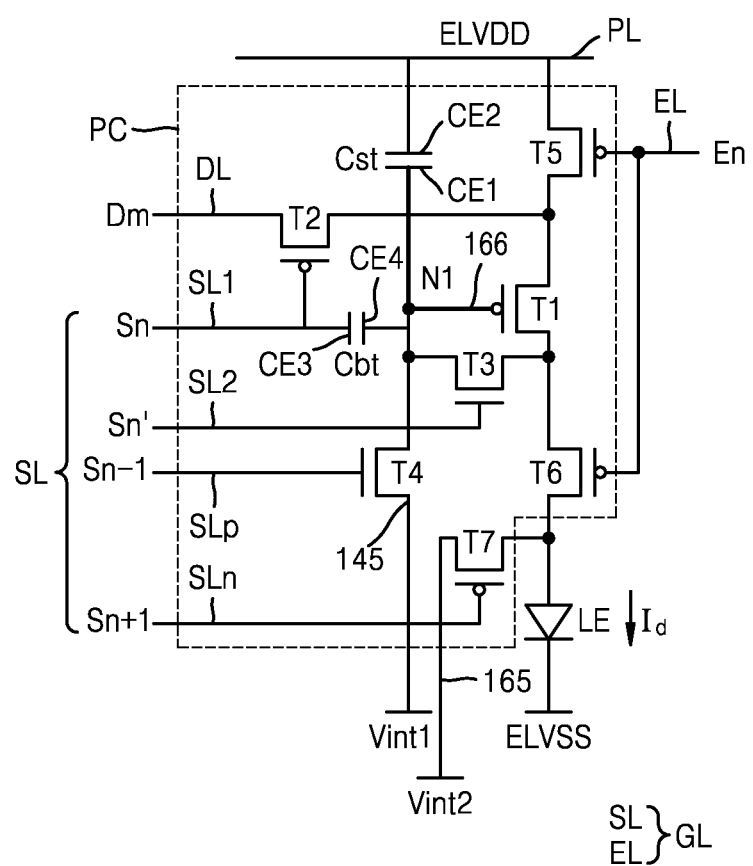
FIG. 2 is a schematic equivalent circuit diagram of a light-emitting diode and a sub-pixel electrode included in a display apparatus according to some embodiments.

FIG. 2 is a schematic equivalent circuit diagram of the light-emitting diode LE and a sub-pixel electrode included in a display apparatus according to some embodiments.

The light-emitting diode LE may be electrically connected to the sub-pixel circuit PC. Referring to FIG. 2, the sub-pixel circuit PC may include first to seventh transistors T1, T2, T3, T4, T5, T6, and T7, a storage capacitor Cst, and a boost capacitor Cbt. According to some embodiments, the sub-pixel circuit PC may not include the boost capacitor Cbt. Hereinafter, for convenience of explanation, the sub-pixel circuit PC including the boost capacitor Cbt is described.

Some of the first to seventh transistors T1 to T7 may be n-channel metal-oxide semiconductor field effect transistors (n-channel MOSFET) (NMOS transistors), and the others may be p-channel metal-oxide semiconductor field-effect transistors (p-channel MOSFET) (PMOS transistors). For example, as illustrated in FIG. 2, the third and fourth transistors T3 and T4 may be NMOS transistors, and the others may be PMOS transistors. According to some embodiments, the third, fourth, and seventh transistors T3, T4, and T7 may be NMOS transistors, and the others may be PMOS transistors. Alternatively, only one of the first to seventh transistors T1 to T7 may be an NMOS transistor, and the others may be PMOS transistors.

The first to seventh transistors T1 to T7, the storage capacitor Cst, and the boost capacitor Cbt may be electrically connected to the gate line GL and the data line DL. The gate line GL may be connected to a gate electrode of each of the first to seventh transistors T1 to T7 and may be configured to provide a gate signal to each gate electrode. The gate line GL may include the scan line SL and the emission control line EL. The scan line SL may include a first scan line SL1 configured to transmit a first scan signal Sn, a second scan line SL2 configured to transmit a second scan signal Sn', a previous scan line SLp configured to transmit a previous scan signal Sn−1, and a next scan line SLn configured to transmit a next scan signal Sn+1.

A driving voltage line PL may be configured to transmit a driving voltage ELVDD to the first transistor T1, and first and second initialization voltage lines 145 and 165 may be configured to transmit first and second initialization voltages Vint1 and Vint2, respectively.

The first transistor T1 may be a driving transistor. A first gate electrode of the first transistor T1 may be connected to the storage capacitor Cst, a first electrode of the first transistor T1 may be electrically connected to the driving voltage line PL through the fifth transistor T5, and a second electrode of the first transistor T1 may be electrically connected to a first electrode (e.g., an anode) of the light-emitting diode LE through the sixth transistor T6. One of the first and second electrodes of the first transistor T1 may be a source electrode, and the other may be a drain electrode. The first transistor T1 may be configured to supply a driving current Id to the light-emitting diode LE according to a switching operation of the second transistor T2. A second electrode (e.g., a cathode) of the light-emitting diode LE is electrically connected to a common voltage line which provides a common voltage ELVSS.

The second transistor T2 may be a switching transistor. A second gate electrode of the second transistor T2 may be connected to the first scan line SL1, a first electrode of the second transistor T2 may be connected to the data line DL, and a second electrode of the second transistor T2 may be connected to the first electrode of the first transistor T1 and may be electrically connected to the driving voltage line PL through the fifth transistor T5. One of the first and second electrodes of the second transistor T2 may be a source electrode, and the other may be a drain electrode. The second transistor T2 may be configured to be turned on in response to the first scan signal Sn received through the first scan line SL1 and may be configured to perform a switching operation of transmitting a data signal Dm transmitted through the data line DL to the first electrode of the first transistor T1.

The third transistor T3 may be a compensation transistor configured to compensate for a threshold voltage of the first transistor T1. A third gate electrode of the third transistor T3 may be connected to the second scan line SL2. A first electrode of the third transistor T3 may be connected to a lower electrode CE1 of the storage capacitor Cst and the first gate electrode of the first transistor T1 through a node connection line 166. The first electrode of the third transistor T3 may be connected to the fourth transistor T4. A second electrode of the third transistor T3 may be connected to the second electrode of the first transistor T1 and may be electrically connected to the first electrode (e.g., the anode) of the light-emitting diode LE through the sixth transistor T6. One of the first and second electrodes of the third transistor T3 may be a source electrode, and the other may be a drain electrode.

The third transistor T3 may be configured to be turned on in response to the second scan signal Sn' (e.g., a compensation control signal) received through the second scan line SL2 and may be configured to electrically connect the first gate electrode and the second electrode of the first transistor T1 with each other to diode-connect the first transistor T1.

The fourth transistor T4 may be a first initialization transistor configured to initialize the first gate electrode of the first transistor T1. A fourth gate electrode of the fourth transistor T4 may be connected to the previous scan line SLp. A first electrode of the fourth transistor T4 may be connected to the first initialization voltage line 145. A second electrode of the fourth transistor T4 may be connected to the lower electrode CE1 of the storage capacitor Cst, the first electrode of the third transistor T3, and the first gate electrode of the first transistor T1. One of the first and second electrodes of the fourth transistor T4 may be a source electrode, and the other may be a drain electrode. The fourth transistor T4 may be configured to be turned on in response to the previous scan signal Sn−1 received through the previous scan line SLp and may be configured to perform an initialization operation of initializing a voltage of the first gate electrode of the first transistor T1 by transmitting the first initialization voltage Vint1 to the first gate electrode of the first transistor T1.

The fifth transistor T5 may be an operation control transistor. A fifth gate electrode of the fifth transistor T5 may be connected to the emission control line EL, such that the fifth transistor T5 may be configured to be turned on in response to a signal received through the emission control line EL. A first electrode of the fifth transistor T5 may be connected to the driving voltage line PL, and a second electrode of the fifth transistor T5 may be connected to the first electrode of the first transistor T1 and the second electrode of the second transistor T2. One of the first and second electrodes of the fifth transistor T5 may be a source electrode, and the other may be a drain electrode.

The sixth transistor T6 may be an emission control transistor. A sixth gate electrode of the sixth transistor T6 may be connected to the emission control line EL, such that the sixth transistor T6 may be configured to be turned on in response to a signal received through the emission control line EL. A first electrode of the sixth transistor T6 may be connected to the second electrode of the first transistor T1 and the second electrode of the third transistor T3, and a second electrode of the sixth transistor T6 may be electrically connected to a second electrode of the seventh transistor T7 and the first electrode (e.g., the anode) of the light-emitting diode LE. One of the first and second electrodes of the sixth transistor T6 may be a source electrode, and the other may be a drain electrode.

The fifth transistor T5 and the sixth transistor T6 may be simultaneously turned on in response to the emission control signal En received through the emission control line EL so that the driving voltage ELVDD may be transmitted to the light-emitting diode LE, and a driving current Id may flow through the light-emitting diode LE.

The seventh transistor T7 may be a second initialization transistor configured to initialize the first electrode (e.g., the anode) of the light-emitting diode LE. A seventh gate electrode of the seventh transistor T7 may be connected to the next scan line SLn. A first electrode of the seventh transistor T7 may be connected to the second initialization voltage line 165. The second electrode of the seventh transistor T7 may be connected to the second electrode of the sixth transistor T6 and the first electrode (e.g., the anode) of the light-emitting diode LE. The seventh transistor T7 may be turned on in response to the next scan signal Sn+1 received through the next scan line SLn and may be configured to transmit the second initialization voltage Vint2 to the first electrode (e.g., the anode) of the light-emitting diode LE to initialize the first electrode of the light-emitting diode LE.

The storage capacitor Cst may include the lower electrode CE1 and an upper electrode CE2. The lower electrode CE1 of the storage capacitor Cst may be connected to the first gate electrode of the first transistor T1, and the upper electrode CE2 of the storage capacitor Cst may be connected to the driving voltage line PL. The storage capacitor Cst may be configured to store a charge corresponding to a difference between a voltage of the first gate electrode of the first transistor T1 and the driving voltage ELVDD.

The boost capacitor Cbt may include a third electrode CE3 and a fourth electrode CE4. The third electrode CE3 may be connected to the second gate electrode of the second transistor T2 and the first scan line SL1, and the fourth electrode CE4 may be connected to the first electrode of the third transistor T3 and the node connection line 166. When the first scan signal Sn supplied through the first scan line SL1 is turned off, the boost capacitor Cbt may increase a voltage of a first node N1, and when the voltage of the first node N1 is increased, a black gradation may be vividly displayed.

The first node N1 may be an area in which the first gate electrode of the first transistor T1, the first electrode of the third transistor T3, the second electrode of the fourth transistor T4, and the fourth electrode CE4 of the boost capacitor Cbt are connected to each other.

According to some embodiments, with reference to FIG. 2, it is described that the third and fourth transistors T3 and T4 are NMOS transistors, and the first, second, and fifth to seventh transistors T1, T2, and T5 to T7 are PMOS transistors. The first transistor T1, which may directly affect the brightness of a display apparatus, may be provided to include a semiconductor layer including polycrystalline silicon having the high reliability, and thus, the high-resolution display apparatus may be realized.

FIG. 2 illustrates that the third and fourth transistors T3 and T4 are NMOS transistors. However, according to some embodiments, the first to seventh transistors T1 to T7 may be PMOS transistors. In this case, the second and third transistors T2 and T3 may be electrically connected to the same scan line. According to some embodiments, the fourth and seventh transistors T4 and T7 may also be electrically connected to the same scan line. According to some embodiments, the fourth and seventh transistors T4 and T7 may be electrically connected to the same initialization voltage line.

The pixel circuit PC illustrated in FIG. 2 is not limited to the components illustrated in FIG. 2. For example, according to some embodiments, the pixel circuit PC may include additional components or fewer components without departing from the spirit and scope of embodiments according to the present disclosure.

Figure 3:
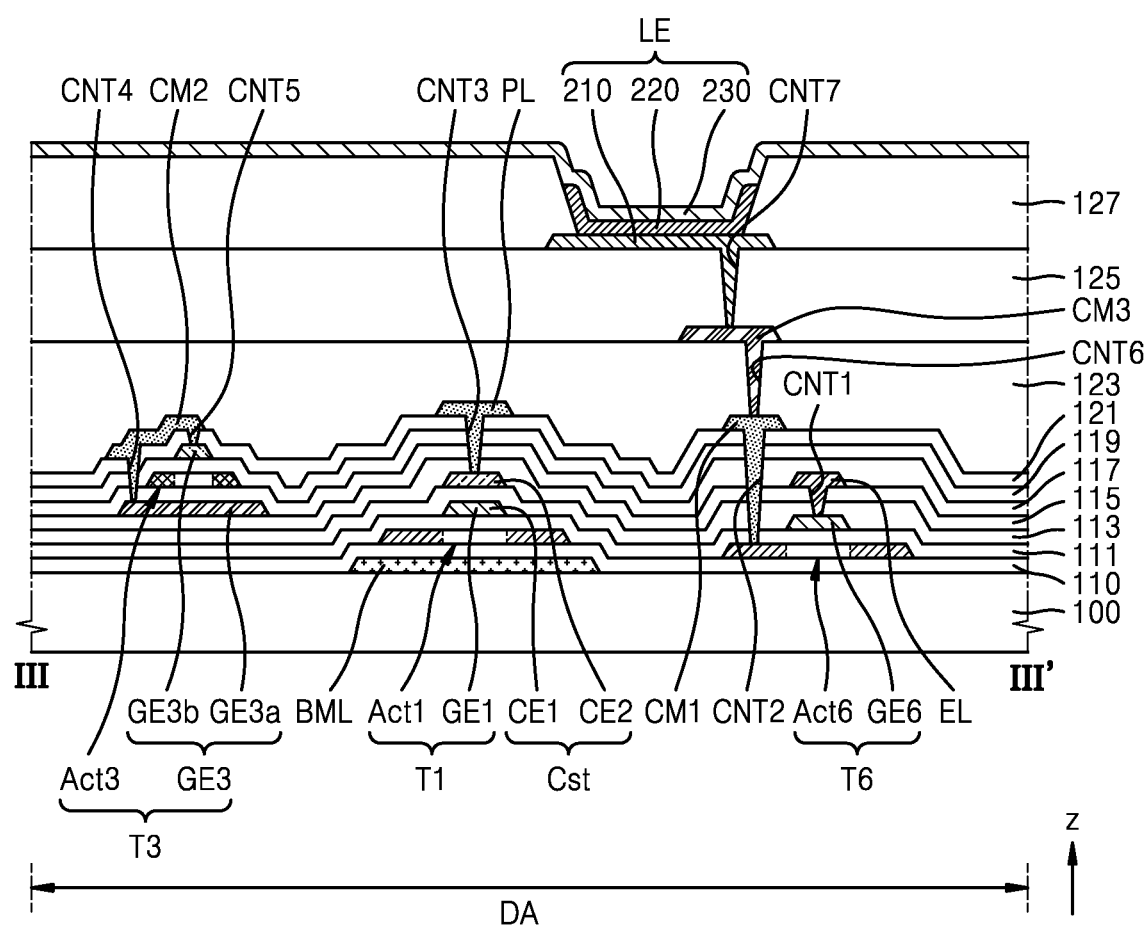
FIG. 3 is a cross-sectional view of a portion of a display apparatus, taken along a line III-III' of FIG. 1, according to some embodiments.

FIG. 3 is a cross-sectional view of a portion of the display apparatus 1, taken along a line III-III' of FIG. 1, according to some embodiments. FIG. 3 illustrates a cross-section of a portion of the display area DA, that is, the first transistor T1, the sixth transistor T6, and the third transistor T3 from among the transistors and the storage capacitor Cst of the sub-pixel circuit PC described with reference to FIG. 2. The first transistor T1 and the sixth transistor T6 may be silicon-based transistors and, as illustrated in FIG. 3, may be arranged on a buffer layer 110.

The third transistor T3 may be an oxide-based transistor and, as illustrated in FIG. 3, may be arranged on a different layer from the silicon-based transistor. For example, the third transistor T3 may be arranged on a third insulating layer 115. FIG. 3 illustrates the first transistor T1 and the sixth transistor T6 as the silicon-based transistors. However, other silicon-based transistors described with reference to FIG. 2, for example, the second, fifth, and seventh transistors T2, T5, and T7, may have substantially the same structure as the first transistor T1 and/or the sixth transistor T6. FIG. 3 illustrates the third transistor T3 as the oxide-based transistor. However, other oxide-based transistors described with reference to FIG. 2, for example, the fourth transistor T4, may have substantially the same structure as the third transistor T3.

A substrate 100 may include a glass material, a ceramic material, a metal material, or a flexible or bendable material. When the substrate 100 is flexible or bendable, the substrate 100 may include polymer resins, such as polyethersulfone, polyacrylate, polyetherimide, polyethylene naphthalate, polyethylene terephthalate, polyphenylene sulfide, polyarylate, polyimide, polycarbonate, or cellulose acetate propionate.

The substrate 100 may have a single-layered or a multi-layered structure including the materials described above, and when the substrate 100 has a multi-layered structure, the substrate 100 may further include a barrier layer including an inorganic insulating material.

The buffer layer 110 may prevent, reduce, or minimize the penetration of impurities into a semiconductor layer of the transistors. The buffer layer 110 may include a single layer or layers including an inorganic insulating material, such as silicon nitride, silicon oxide, and/or silicon oxynitride.

A bottom metal layer BML may be included between the substrate 100 and the buffer layer 110. The bottom metal layer BML may include a conductive material including Mo, Al, Cu, Ti, etc. and may include layers or a single layer including the conductive material described above.

The bottom metal layer BML may at least partially overlap a first semiconductor layer Act1 of the first transistor T1. The bottom metal layer BML may protect the first semiconductor layer Act1. The bottom metal layer BML may be configured to receive an arbitrary (or set or predetermined) voltage. When a pixel circuit including an NMOS transistor and a PMOS transistor together is driven through the bottom metal layer BML to which a voltage (e.g., a set, predetermined, or arbitrary voltage) is applied, unnecessary charge accumulation in the first semiconductor layer Act1 may be prevented or reduced. Thus, the characteristics of the first transistor T1 including the first semiconductor layer Act1 may be stably maintained.

The first semiconductor layer Act1 of the first transistor T1 and a sixth semiconductor layer Act6 of the sixth transistor T6 may be arranged on the buffer layer 110. The first semiconductor layer Act1 and the sixth semiconductor layer Act6 may include amorphous silicon or polysilicon. Each of the first semiconductor layer Act1 and the sixth semiconductor layer Act6 may include a channel area, a source area and a drain area arranged at both sides of the channel area. The source area and the drain area are doped with dopants and may correspond to the source electrode and the drain electrode described with reference to FIG. 2.

A first insulating layer 111 may be arranged on the first semiconductor layer Act1 and the sixth semiconductor layer Act6. The first insulating layer 111 and a second insulating layer 113 may include an inorganic insulating material, such as $SiO_x$, $SiN_x$, SiON, aluminum oxide, titanium oxide, tantalum oxide, hafnium oxide, or zinc oxide. Zinc oxide may include ZnO and/or $ZnO_2$.

Each of the first gate electrode GE1 and the sixth gate electrode GE6 may include a conductive material including Mo, Al, Cu, Ti, etc. Each of the first gate electrode GE1 and the sixth gate electrode GE6 may include layers or a single layer including the materials described above. For example, the first gate electrode GE1 and the sixth gate electrode GE6 may have a single-layered structure including Mo.

A portion of the first gate electrode GE1 may correspond to the lower electrode CE1 of the storage capacitor Cst. In other words, the first gate electrode GE1 may have the lower electrode CE1 of the storage capacitor Cst. Also, in other words, a portion of the lower electrode CE1 of the storage capacitor Cst may correspond to the first gate electrode GE1.

The second insulating layer 113 may be arranged on the first gate electrode GE1 and the sixth gate electrode GE6. The second insulating layer 113 may include an inorganic insulating material, such as $SiO_x$, $SiN_x$, SiON, aluminum oxide, titanium oxide, tantalum oxide, hafnium oxide, or zinc oxide.

The upper electrode CE2 of the storage capacitor Cst may include a conductive material including Mo, Al, Cu, Ti, etc. and may include layers or a single layer including the materials described above. According to some embodiments, the upper electrode CE2 of the storage capacitor Cst may include a material having a relatively small resistance. For example, the lower electrode CE1 may include a single layer including Mo, and the upper electrode CE2 may have a multi-layered structure including an Al layer and a Ti layer.

A third insulating layer 115 may be arranged on the upper electrode CE2 of the storage capacitor Cst. The third insulating layer 115 may include an inorganic insulating material, such as $SiO_x$, $SiN_x$, SiON, aluminum oxide, titanium oxide, tantalum oxide, hafnium oxide, or zinc oxide.

The gate line, for example, the emission control line EL illustrated in FIG. 3, may be arranged on the third insulating layer 115. The emission control line EL may include a conductive material including Mo, Al, Cu, Ti, etc. and may include layers or a single layer including the materials described above. According to some embodiments, the gate line, for example, the emission control line EL illustrated in FIG. 3, may have a relatively low-resistance material. For example, the gate line, such as the emission control line EL, may have a layered structure including an Al layer and a Ti layer. The emission control line EL may be electrically connected to the sixth gate electrode GE6 through a first contact hole CNT1 passing through the third insulating layer 115 and the second insulating layer 113.

FIG. 3 illustrates the emission control line EL and the sixth gate electrode GE6 as the gate line and the gate electrode arranged on different layers from each other. However, embodiments according to the present disclosure are not limited thereto. Other gate lines and other gate electrodes electrically connected to the corresponding other gate lines may have the same structure as the emission control line EL and the sixth gate electrode GE6. For example, each of an electrical connection structure of the first scan line and the second gate electrode of the second transistor and an electrical connection structure of the emission control line EL and the fifth gate electrode of the fifth transistor described with reference to FIG. 2 may have the same structure as the electrical connection structure of the emission control line EL and the sixth gate electrode GE6.

A second semiconductor layer and the second gate electrode of the second transistor and a fifth semiconductor layer and the fifth gate electrode of the fifth transistor each may be arranged on the same layer and may include the same material as the sixth semiconductor layer Act6 and the sixth gate electrode GE6 illustrated in FIG. 3.

The third transistor T3 may be arranged on the third insulating layer 115. A third semiconductor layer Act3 of the third transistor T3 may be arranged on a fourth insulating layer 117. The third gate electrode GE3 may include a third lower gate electrode GE3a arranged below the third semiconductor layer Act3 and a third upper gate electrode GE3b arranged above the third semiconductor layer Act3. The third lower gate electrode GE3a may be arranged below the fourth insulating layer 117, and the third upper gate electrode GE3b may be arranged above a fifth insulating layer 119 on the third semiconductor layer Act3.

The third semiconductor layer Act3 may include an oxide semiconductor. For example, the third semiconductor layer Act3 may include an InSnZnO (ITZO) semiconductor layer, an InGaZnO (IGZO) semiconductor layer, etc. The oxide semiconductor may have a large band gap (about 3.1 eV), a high carrier mobility, and a low leakage current, and thus, even when a driving time is increased, a voltage drop may not be large. Thus, even in a low frequency operation, there may be a less luminance change due to a voltage drop.

Each of the third lower gate electrode GE3a and the third upper gate electrode GE3b may include a conductive material including Mo, Al, Cu, Ti, or the like and may include layers or a single layer including the material described above. The third lower gate electrode GE3a illustrated in FIG. 3 may correspond to the gate line configured to provide the gate signal to the third transistor T3, for example, a portion of the second scan line SL2 described with reference to FIG. 2. The third lower gate electrode GE3a may be arranged on the same layer as the gate line, for example, the emission control line EL illustrated in FIG. 3. The third lower gate electrode GE3a may include the same material as the upper electrode CE2 of the storage capacitor Cst and/or the gate line, for example, the emission control line EL illustrated in FIG. 3. For example, each of the third lower gate electrode GE3a and the emission control line EL may have a double-layered structure including an Al layer and a Ti layer, and the third upper gate electrode GE3b may have a double-layered structure including a Mo layer and a Ti layer.

Each of the fourth insulating layer 117 and the fifth insulating layer 119 may include an inorganic insulating material, such as $SiO_x$, $SiN_x$, SiON, aluminum oxide, titanium oxide, tantalum oxide, hafnium oxide, or zinc oxide.

A sixth insulating layer 121 may be arranged on the third upper gate electrode GE3b. The sixth insulating layer 121 may include $SiO_x$, $SiN_x$, SiON, aluminum oxide, titanium oxide, tantalum oxide, hafnium oxide, or zinc oxide.

A first connection metal CM1, a second connection metal CM2, and the driving voltage line PL may be arranged on the sixth insulating layer 121. The first connection metal CM1, the second connection metal CM2, and the driving voltage line PL may include a conductive material including Al, Cu, Ti, etc. and may include layers or a single layer including the materials described above. For example, the first connection metal CM1, the second connection metal CM2, and the driving voltage line PL may include a triple-layered structure including a Ti layer, an Al layer, and a Ti layer. According to some embodiments, the data line DL described with reference to FIG. 2 may be arranged on the same layer and may include the same material as the driving voltage line PL.

The first connection metal CM1 may be electrically connected to the sixth semiconductor layer Act6 through a second contact hole CNT2. The second contact hole CNT2 may pass through the insulating layers arranged between the first connection metal CM1 and the sixth semiconductor layer Act6.

The driving voltage line PL may be electrically connected to the upper electrode CE2 of the storage capacitor Cst through a third contact hole CNT3. The third contact hole CNT3 may pass through the insulating layers (e.g., the third to sixth insulating layers 115 to 121) arranged between the driving voltage line PL and the upper electrode CE2 of the storage capacitor Cst.

The second connection metal CM2 may be electrically connected to the third lower gate electrode GE3a and the third upper gate electrode GE3b through a fourth contact hole CNT4 and a fifth contact hole CNT5, respectively. The fourth contact hole CNT4 may pass through the fourth to sixth insulating layers 117, 119, and 121, and the fifth contact hole CNT5 may pass through the sixth insulating layer 121.

A seventh insulating layer 123 may be arranged on the first connection metal CM1, the second connection metal CM2, the driving voltage line PL, and the data line. The seventh insulating layer 123 may include an organic insulating material. The seventh insulating layer 123 may include benzocyclobutene (BCB), polyimide, hexamethyldisiloxane (HMDSO), polymethylmethacrylate (PMMA), or a general-purpose polymer, such as polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

A third connection metal CM3 may be arranged on the seventh insulating layer 123. The third connection metal CM3 may include a conductive material including Al, Cu, Ti, etc. and may include layers or a single layer including the materials described above. For example, the third connection metal CM3 may include a triple-layered structure including a Ti layer, an Al layer, and a Ti layer.

The third connection metal CM3 may be electrically connected to the first connection metal CM1 through a sixth contact hole CNT6 passing through the seventh insulating layer 123. An eighth insulating layer 125 may be arranged on the third connection metal CM3. The eighth insulating layer 125 may include an organic insulating material.

The light-emitting diode LE may include a first electrode 210, an intermediate layer 220 including an organic emission layer, and a second electrode 230, which are arranged on the eighth insulating layer 125.

The first electrode 210 may be electrically connected to the transistor, for example, the sixth transistor T6, through a seventh contact hole CNT7 passing through the eighth insulating layer 125. The first electrode 210 may be a transflective electrode or a reflection electrode. According to some embodiments, the first electrode 210 may include a reflective layer including Ag, Mg, Al, Pt, Pd, Au, Ni, Nd, Ir, Cr, and a compound or combination thereof, and a transparent or semi-transparent electrode layer on the reflective layer. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). According to some embodiments, the first electrode 210 may include ITO/Ag/ITO.

A bank layer 127 may include at least one organic insulating material selected from the group consisting of polyimide, polyamide, acryl resins, BCB, and phenol resins. Alternatively, the bank layer 127 may include an inorganic insulating material, such as silicon nitride, silicon oxide, and/or silicon oxynitride.

At least a portion of the intermediate layer 220 may be arranged in an opening of the bank layer 127. The intermediate layer 220 may include an organic emission layer. The organic emission layer may include an organic material including a fluorescent or phosphorescent material for emitting red, green, blue, or white light. The organic emission layer may include a low-molecular weight organic material or a high-molecular weight organic material.

The intermediate layer 220 may include a functional layer, such as a hole transport layer (HTL), a hole injection layer (HIL), an electron transport layer (ETL), and/or an electron injection layer (EIL), below and/or above an organic emission layer.

The second electrode 230 may include a transmissive electrode or a reflection electrode. According to some embodiments, the second electrode 230 may include a transparent or semi-transparent electrode and may include a metal thin-film having a low work function, such as Li, Ca, Al, Ag, Mg, and a compound thereof, e.g., LiF, or a material with multilayer structure such as LiF/Ca or LiF/Al. Also, a transparent conductive oxide (TCO) layer including ITO, IZO, ZnO, $In_2O_3$, or the like may further be arranged above the metal thin-film.

The light-emitting diode LE may be covered by an encapsulation layer including at least one organic encapsulation layer and at least one inorganic encapsulation layer.

Figure 4:
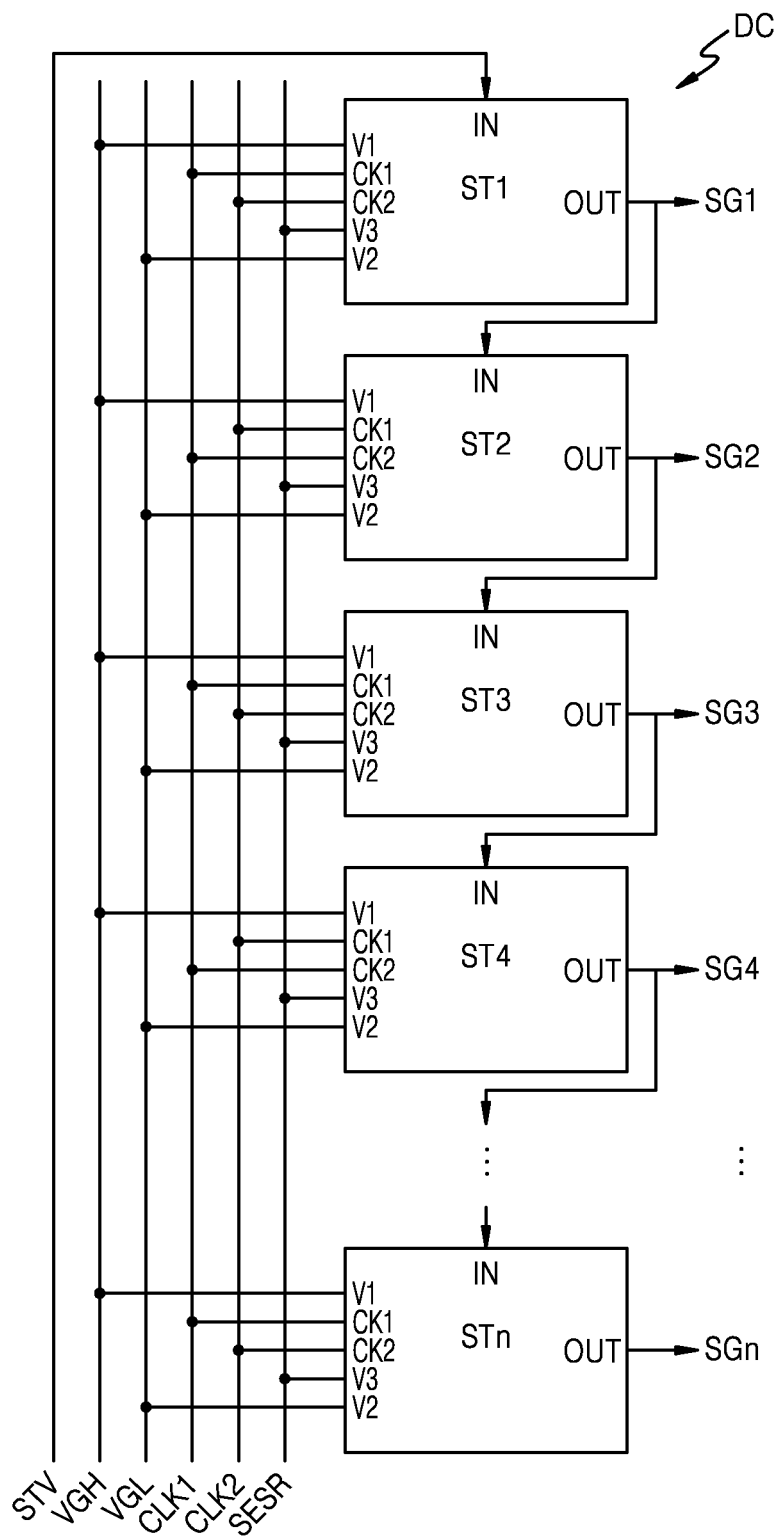
FIG. 4 is a schematic equivalent circuit diagram of a gate driver arranged in a non-display area of a display apparatus according to some embodiments.

FIG. 4 is a schematic equivalent circuit diagram of the gate driver DC arranged in the non-display area NDA of the display apparatus 1 according to some embodiments. Referring to FIG. 4, the gate driver DC arranged in the non-display area NDA (see FIG. 1) described with reference to FIG. 1 may include a plurality of stages. For example, the plurality of stages may include first to $n^{th}$ stages ST1 to STn. Each of the first to $n^{th}$ stages ST1 to STn may correspond to a sub-pixel circuit row arranged in the display area. For example, the first to $n^{th}$ stages ST1 to STn may be electrically connected to the sub-pixel circuits arranged in first to $n^{th}$ rows, respectively. The number of stages of the gate driver DC may be variously modified according to the number of sub-pixel circuit rows. Each of the first to $n^{th}$ stages ST1 to STn may include at least one transistor and at least one capacitor.

Each of the first to $n^{th}$ stages ST1 to STn may output signals in response to a start signal or a previous signal. The signal output by each of the first to $n^{th}$ stages ST1 to STn may be the gate signal applied to the sub-pixel circuit PC described with reference to FIG. 2. According to some embodiments, the signal output by each of the first to $n^{th}$ stages ST1 to STn may be the scan signal applied to the sub-pixel circuit PC described with reference to FIG. 2, for example, the first scan signal Sn, the second scan signal Sn', the previous scan signal Sn−1, and/or the next scan signal Sn+1. According to some embodiments, the signal output by each of the first to $n^{th}$ stages ST1 to STn may be the emission control signal En applied to the sub-pixel circuit PC described with reference to FIG. 2.

Each of the first to $n^{th}$ stages ST1 to STn may include an input terminal IN, a first clock terminal CK1, a second clock terminal CK2, a first voltage input terminal V1, a second voltage input terminal V2, a third voltage input terminal V3, and an output terminal OUT.

The input terminal IN may receive an external signal STV or the previous signal as the start signal. According to some embodiments, the external signal STV may be applied to the input terminal IN of the first stage ST1, and the previous signal, output by a previous stage to the input terminal IN, may be applied to each of the second to $n^{th}$ stages ST2 to STn except for the first stage ST1. For example, the first stage ST1 may be started to be driven by the external signal STV and may generate and output a first signal SG1. The second stage ST2 may be started to be driven by the first signal SG1 and may generate and output a second signal SG2. An $n-1^{th}$ signal output from the $n-1^{th}$ stage may be input to the input terminal IN of the $n^{th}$ stage STn, and the $n^{th}$ stage STn may generate and output an $n^{th}$ signal SGn.

A first clock signal CLK1 or a second clock signal CLK2 may be applied to the first clock terminal CK1 and the second clock terminal CK2. According to some embodiments, the first clock signal CLK1 and the second clock signal CLK2 may be alternately applied to the first to $n^{th}$ stages ST1 to STn. For example, the first clock signal CLK1 may be applied to the first clock terminal CK1 of a stage in the order of odd numbers, and the second clock signal CLK2 may be applied to the second clock terminal CK2 of the stage in the order of odd numbers. The second clock signal CLK2 may be applied to the first clock terminal CK1 of a stage in the order of even numbers, and the first clock signal CLK1 may be applied to the second clock terminal CK2 of the stage in the order of even numbers.

The first voltage input terminal V1 may receive a first voltage VGH that is a high voltage, and the second voltage input terminal V2 may receive a second voltage VGL that is a low voltage. The first voltage VGH and the second voltage VGL may be rated voltages applied to the gate driver DC. The first voltage VGH and the second voltage VGL may be global signals and may be supplied from a controller and/or a power supply. The third voltage input terminal V3 may receive a third voltage SESR. The third voltage SESR may be a voltage configured to solve a flickering problem of the display apparatus. According to some embodiments, the third voltage SESR may be omitted.

The output terminal OUT may output a signal. According to some embodiments, the signal may be the scan signal or the previous scan signal and may be supplied to the sub-pixel circuit through the scan line or the previous scan line. Alternatively, the signal may be the emission control signal and may be supplied to the sub-pixel circuit through the emission control line. According to some embodiments, the signal may be a carry signal and may be supplied to the input terminal IN of a next stage.

Figure 5A:
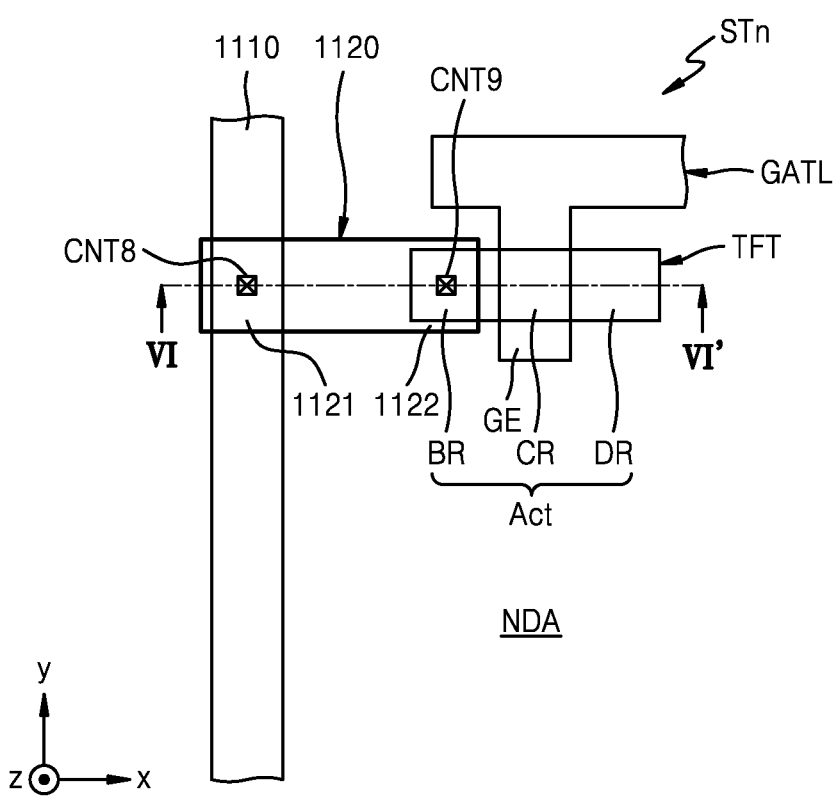
FIGS. 5A and 5B are schematic plan views of a transistor included in any one stage of a gate driver of a display apparatus according to some embodiments and a conductive line connected to the transistor.
Figure 5B:
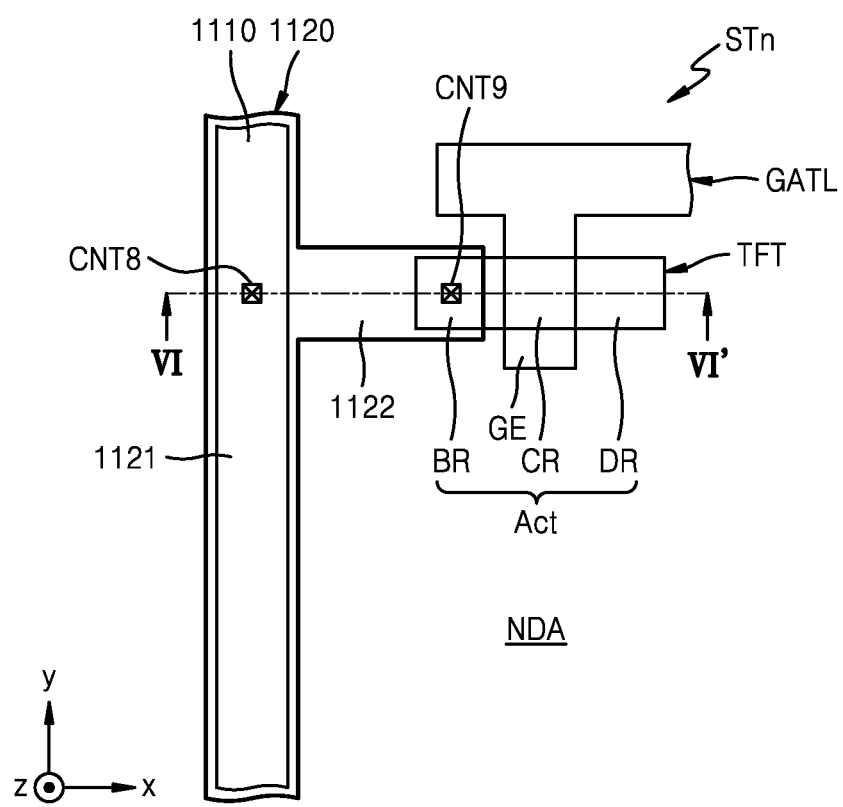

Each of FIGS. 5A and 5B is a schematic plan view of a transistor TFT included in any one stage of the gate driver of the display apparatus according to some embodiments and a conductive line 1110 connected to the transistor TFT.

Referring to FIG. 5A, the transistor TFT included in any one stage arranged in the non-display area NDA, for example, the $n^{th}$ stage STn, may include a semiconductor layer Act and a gate electrode GE. The gate electrode GE may be a portion of a gate electrode layer GATL arranged on the semiconductor layer Act. In other words, the portion of the gate electrode layer GATL may correspond to the gate electrode GE overlapping a channel area CR of the semiconductor layer Act.

The conductive line 1110 arranged in the non-display area NDA may be configured to provide a signal or a voltage to the transistor TFT included in the $n^{th}$ stage STn. For example, the conductive line 1110 illustrated in FIG. 5A may be a signal line configured to provide the first clock signal CLK1 or the second clock signal CLK2 described above with reference to FIG. 4. According to some embodiments, the conductive line 1110 may be a signal line configured to provide the external signal STV or a voltage line configured to provide the first voltage VGH, the second voltage VGL, or the third voltage SESR.

The conductive line 1110 may extend in a direction (for example, a y direction) in the non-display area NDA. The conductive line 1110 may be electrically connected to the transistor TFT through a connection line 1120. The connection line 1120 may include a portion extending in a direction crossing the conductive line 1110. For example, a first portion 1121 of the connection line 1120 may overlap at least a portion of the conductive line 1110, and a second portion 1122 of the connection line 1120 may overlap a portion of the transistor TFT, for example, a portion of the semiconductor layer Act.

The first portion 1121 of the connection line 1120 may be electrically connected to the conductive line 1110 through an eighth contact hole CNT8. The second portion 1122 of the connection line 1120 may be electrically connected to a portion (impurity areas BR and DR arranged at both sides of the channel area CR) of the semiconductor layer Act of the transistor TFT through a ninth contact hole CNT9.

Referring to FIG. 5B, a portion of the connection line 1120, for example, the first portion 1121 of the connection line 1120, may extend in an extension direction of the conductive line 1110. For example, the first portion 1121 of the connection line 1120 may extend in the same direction (for example, the y direction) as the conductive line 1110.

Figure 6A:
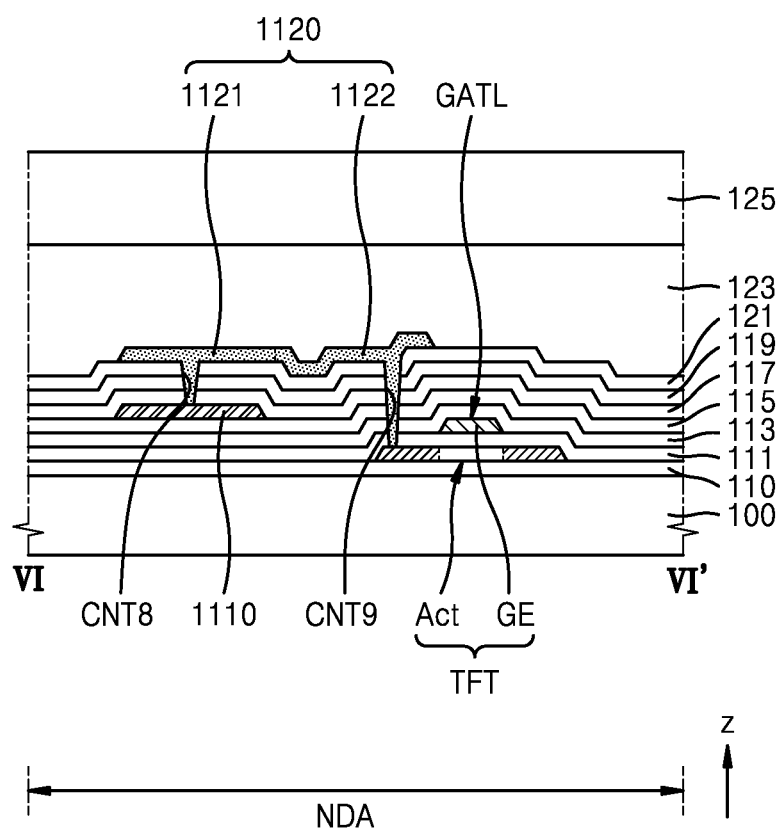
FIGS. 6A and 6B are cross-sectional views of a non-display area of a display apparatus, taken along a line VI-VI' of FIG. 5A or 5B, according to some embodiments.
Figure 6B:
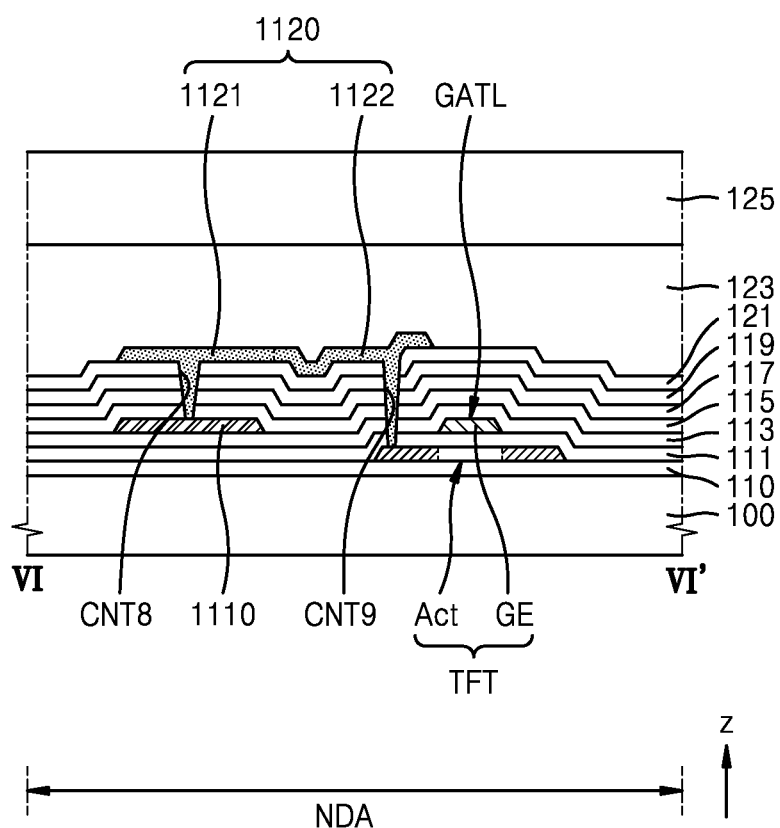

Each of FIGS. 6A and 6B is a cross-sectional view of the non-display area of the display apparatus, taken along a line VI-VI' of FIG. 5A or 5B, according to some embodiments.

Referring to FIG. 6A, the semiconductor layer Act of the transistor TFT described with reference to FIGS. 5A and 5B may be arranged on an upper surface of the buffer layer 110 arranged on the substrate 100. The semiconductor layer Act of the transistor TFT may include the same material as the semiconductor layer of the silicon-based transistor (e.g., the first transistor) described above with reference to FIG. 3. The gate electrode layer GATL including the gate electrode GE of the transistor TFT may be arranged on the first insulating layer 111.

The conductive line 1110 may be arranged on a different layer from the transistor TFT. For example, the conductive line 1110 may be arranged on the third insulating layer 115.

The conductive line 1110 may be arranged on the same layer and may include the same material as the third lower gate electrode GE3a corresponding to the gate line described above with reference to FIG. 3, for example, the emission control line EL and/or the second scan line SL2. For example, the conductive line 1110 may include a conductive material including Mo, Al, Cu, Ti, etc. and may include layers or a single layer including the materials described above. According to some embodiments, the conductive line 1110 may have a double-layered structure including an Al layer and a Ti layer.

The connection line 1120 may be arranged on the conductive line 1110 and the transistor TFT with at least one insulating layer therebetween. For example, the connection line 1120 may be arranged on the sixth insulating layer 121.

The first portion 1121 of the connection line 1120 may be electrically connected to the conductive line 1110 through the eighth contact hole CNT8 passing through the fourth insulating layer 117, the fifth insulating layer 119, and the sixth insulating layer 121. The first portion 1121 of the connection line 1120 may be in direct contact with an upper surface of the conductive line 1110 through the eighth contact hole CNT8.

The second portion 1122 of the connection line 1120 may be electrically connected to the transistor TFT, for example, the semiconductor layer Act of the transistor TFT, through the ninth contact hole CNT9 passing through the first to sixth insulating layers 111, 113, 115, 117, 119, and 121. The second portion 1122 of the connection line 1120 may be in direct contact with the transistor TFT, for example, an upper surface of the semiconductor layer Act of the transistor TFT, through the ninth contact hole CNT9.

FIG. 6A illustrates that the conductive line 1110 is arranged on the third insulating layer 115. However, embodiments according to the present disclosure are not limited thereto. According to some embodiments, as illustrated in FIG. 6B, the conductive line 1110 may be arranged on the same layer as the upper electrode CE2 of the storage capacitor Cst described above with reference to FIG. 3. For example, the conductive line 1110 may be arranged on the second insulating layer 113. The conductive line 1110 may include the same material as the upper electrode CE2 of the storage capacitor Cst.

FIGS. 5A, 5B, 6A, and 6B illustrate that the connection line 1120 electrically connects the conductive line 1110 with the semiconductor layer Act of the transistor TFT. However, embodiments according to the present disclosure are not limited thereto. According to some embodiments, the connection line 1120 may electrically connect the conductive line 1110 with the gate electrode GE of the transistor TFT.

According to some embodiments, the conductive line 1110 and the transistor TFT may be electrically connected to each other through the connection line 1120 arranged on the conductive line 1110 and the transistor TFT, and thus, damage to the transistor TFT due to plasma generated in a process of forming a plurality of contact holes in a manufacturing process of a display apparatus, may be minimized, reduced, or prevented. For example, according to some embodiments, before the connection line 1120 is formed, there is no conductive part electrically connected to the semiconductor layer Act or the gate electrode layer GATL of the transistor TFT. Thus, it may be possible to minimize, reduce, or prevent damage to the transistor TFT caused by the plasma generated in the manufacturing process of the display apparatus through the conductive part.

Figure 7:
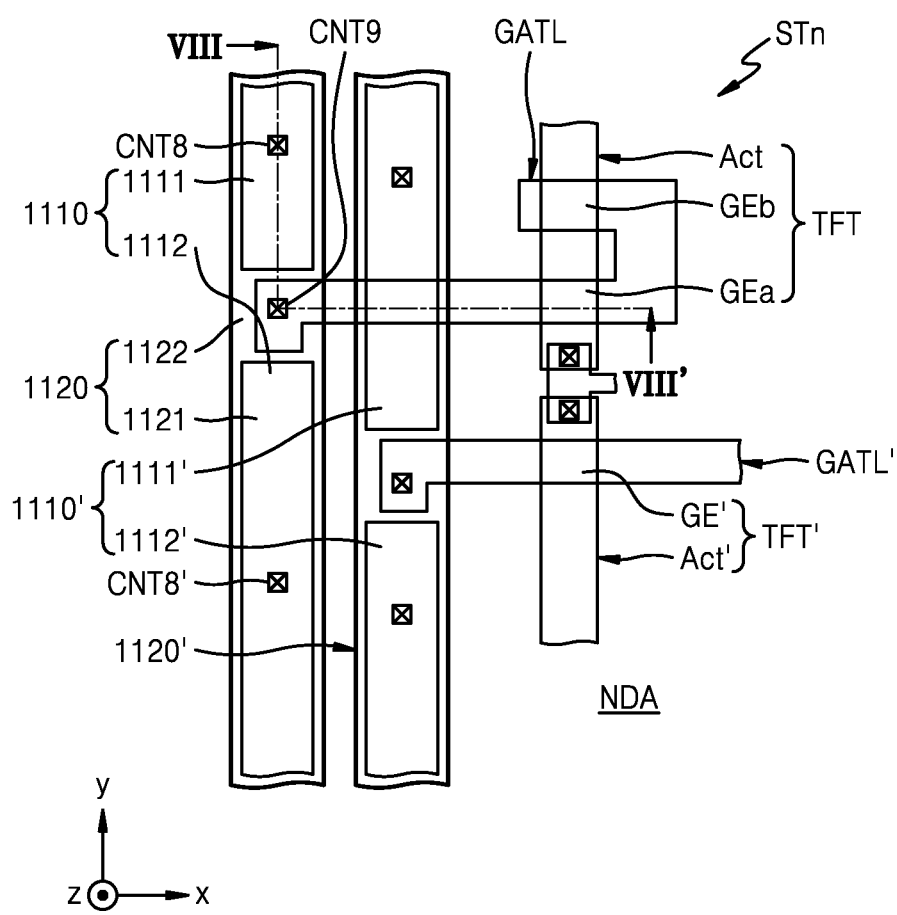
FIG. 7 is a schematic plan view of a transistor included in any one stage of a gate driver of a display apparatus according to some embodiments and a conductive line connected to the transistor.
Figure 8:
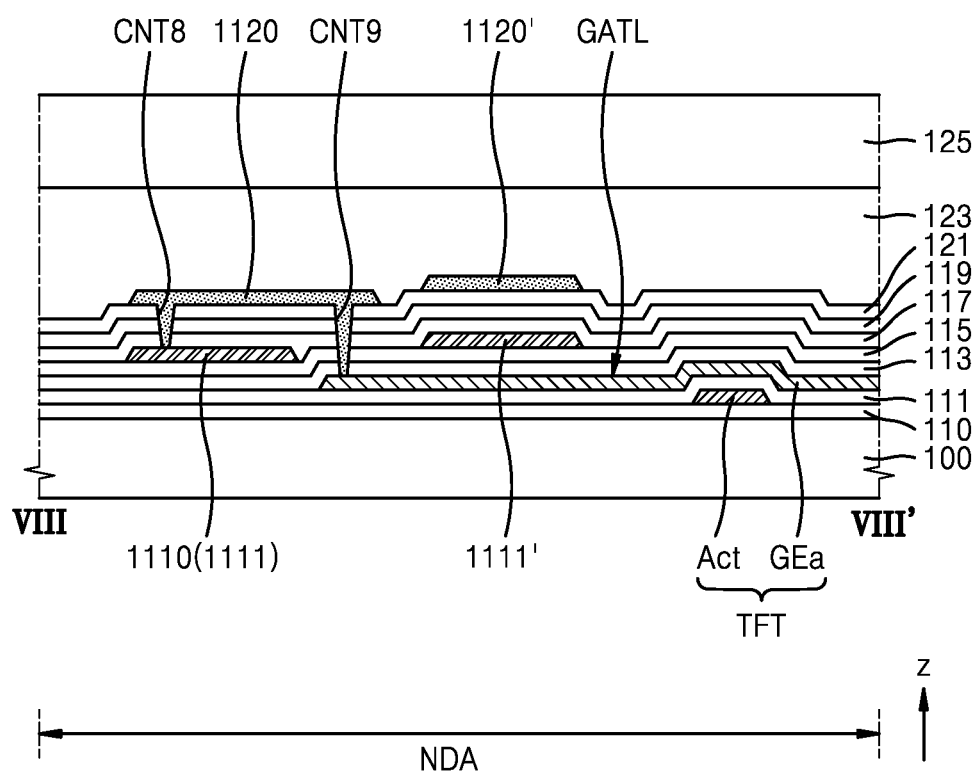
FIG. 8 is a cross-sectional view of the transistor included in any one stage of the gate driver of the display apparatus and the conductive line connected to the transistor, taken along a line VIII-VIII' of FIG. 7.

FIG. 7 is a schematic plan view of a transistor included in any one stage of a gate driver of a display apparatus according to some embodiments and a conductive line connected to the transistor, and FIG. 8 is a cross-sectional view of the transistor included in any one stage of the gate driver of the display apparatus and the conductive line connected to the transistor, taken along a line VIII-VIII' of FIG. 7.

Referring to FIG. 7, in the non-display area NDA, the conductive line 1110 may include a first conductive part 1111 and a second conductive part 1112 spaced apart from each other in an extension direction (e.g., a y direction) of the conductive line 1110. At least a portion of the connection line 1120 arranged on the conductive line 1110 may extend in the extension direction of the conductive line 1110 and may overlap the first conductive part 1111 and the second conductive part 1112.

The transistor TFT of the $n^{th}$ stage STn may include the semiconductor layer Act and the gate electrode layer GATL. According to some embodiments, the transistor TFT may include a dual-gate electrode. With respect to this aspect, FIG. 7 illustrates that the gate electrode layer GATL includes two gate electrodes GEa and GEb overlapping the semiconductor layer Act of the transistor TFT.

A portion of the gate electrode layer GATL may extend toward the conductive line 1110. For example, a portion of the gate electrode layer GATL may extend between the first conductive part 1111 and the second conductive part 1112.

The connection line 1120 may electrically connect the conductive line 1110 with the transistor TFT, for example, the gate electrode layer GATL of the transistor TFT. The first portion 1121 of the connection line 1120 may overlap the first conductive part 1111 and the second conductive part 1112, and the second portion 1122 of the connection line 1120 may overlap a portion of the transistor TFT, for example, the gate electrode layer GATL.

The first portion 1121 of the connection line 1120 may be electrically connected to the first conductive part 1111 and the second conductive part 1112 through eighth contact holes CNT8 and CNT8', respectively. The second portion 1122 of the connection line 1120 may be electrically connected to the gate electrode layer GATL through the ninth contact hole CNT9.

Referring to FIG. 8, the semiconductor layer Act of the transistor TFT may be arranged on the buffer layer 110, and the gate electrode layer GATL including the gate electrode (e.g., GEa) may be arranged on the first insulating layer 111 corresponding to a gate insulating layer.

The first conductive part 1111 corresponding to the conductive line 1110 may be arranged on the third insulating layer 115. According to some embodiments, the conductive line 1110 including the first conductive part 1111 may be arranged on the second insulating layer 113.

The connection line 1120 may be arranged on the conductive line 1110 with an insulating layer therebetween. According to some embodiments, FIG. 8 illustrates that the connection line 1120 is arranged on the conductive line 1110 with the fourth to sixth insulating layers 117, 119, and 121 therebetween.

The connection line 1120 may be electrically connected to the conductive line 1110 through the eighth contact hole CNT8 passing through the fourth to sixth insulating layers 117, 119, and 121. The connection line 1120 may be electrically connected to the gate electrode layer GATL through the ninth contact hole CNT9 passing through the insulating layer arranged between the gate electrode layer GATL and the connection line 1120, for example, the second to sixth insulating layers 113, 115, 117, 119, and 121.

A connection structure of another conductive line 1110', another connection line 1120', and another transistor TFT' illustrated in FIG. 7 may be substantially the same as the connection structure of the conductive line 1110, the connection line 1120, and the transistor TFT described with reference to FIGS. 7 and 8. The other transistor TFT' described above may include a semiconductor layer Act' and a gate electrode layer GATL', and the semiconductor layer Act' and the gate electrode layer GATL' may be arranged on the same layer and may include the same material as the semiconductor layer Act and the gate electrode layer GATL of the transistor TFT, respectively. The gate electrode GE' may be a portion of a gate electrode layer GATL' 'arranged on the semiconductor layer Act'.

Any one of the conductive lines 1110 and 1110' illustrated in FIG. 7 may be a signal line configured to provide the first clock signal CLK1 (see FIG. 4) described with reference to FIG. 4, and the other may be a signal line configured to provide the second clock signal CLK2 (see FIG. 4). According to some embodiments, any one of the conductive lines 1110 and 1110' may be configured to provide the external signal STV or the first to third voltages VGH, VGL, and SESR.

Figure 9:
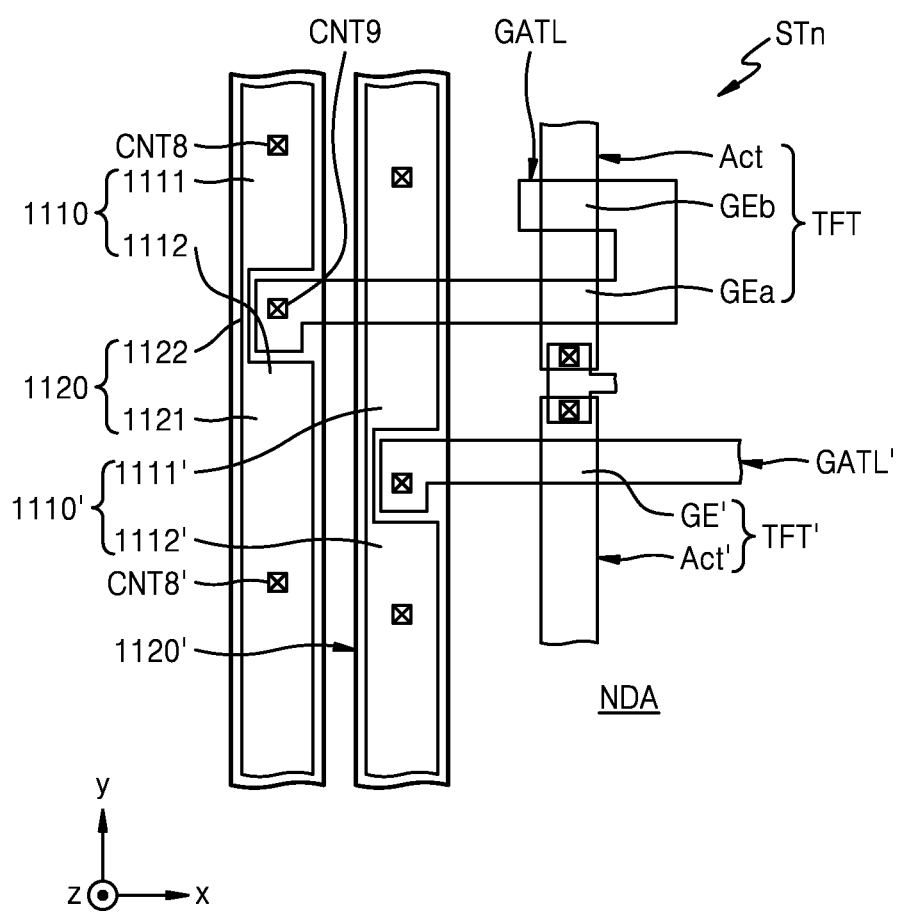
FIG. 9 is a schematic plan view of a transistor included in any one stage of a gate driver of a display apparatus according to some embodiments and a conductive line connected to the transistor.

FIG. 9 is a schematic plan view of a transistor included in any one stage of a gate driver of a display apparatus according to some embodiments and a conductive line connected to the transistor.

According to some embodiments as described with reference to FIG. 7, the conductive lines 1110 and 1110' may include the first conductive parts 1111 and 1111' and the second conductive parts 1112 and 1112' spaced apart from each other. According to some embodiments as described with reference to FIG. 9, the first conductive parts 1111 and 1111' and the second conductive parts 1112 and 1112' of the conductive lines 1110 and 1110' may be connected to each other around the ninth contact hole CNT9.

As described above, according to the one or more of the above embodiments of the disclosure, damage to components, for example, a transistor, of a display apparatus due to plasma, etc. generated in a process of manufacturing the display apparatus may be prevented or reduced. The effects described above are examples, and the effects of embodiments according to the present disclosure are not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:
    a plurality of light-emitting diodes in a display area;
    a gate driver in a non-display area around the display area, the gate driver including a plurality of stages;
    a conductive line in the non-display area and elongated along an extension direction;
    an insulating layer above the conductive line; and
    a connection line above the insulating layer and electrically connecting the conductive line with a transistor of a first stage from among the plurality of stages, the transistor including a semiconductor layer and a gate electrode layer;

a gate insulating layer interposed between the semiconductor layer of the transistor and the gate electrode layer of the transistor; and an interlayer insulating layer interposed between the gate insulating layer and the insulating layer, wherein, in a plan view, the connection line is elongated along the extension direction with a first portion of the connection line entirely overlapping the conductive line along the extension direction, in a cross-sectional view, the conductive line is interposed between the interlayer insulating layer and the insulating layer.

2. The display apparatus of claim 1, wherein the first portion of the connection line is electrically connected to the conductive line through a first contact hole passing through the insulating layer, and a second portion of the connection line is electrically connected to the transistor through a second contact hole passing through the insulating layer and the interlayer insulating layer.

3. The display apparatus of claim 2, wherein the second portion of the connection line directly contacts the semiconductor layer or the gate electrode layer through the second contact hole.

4. The display apparatus of claim 1, wherein the conductive line includes at least one metal selected from Al, Cu, or Ti.

5. The display apparatus of claim 1, wherein the conductive line includes a first conductive part and a second conductive part spaced apart from each other in the extension direction of the conductive line, and the connection line is electrically connected to each of the first conductive part and the second conductive part.

6. The display apparatus of claim 1, further comprising a sub-pixel circuit arranged in the display area and including transistors electrically connected to a first light-emitting diode from among the plurality of light-emitting diodes, wherein the first stage is configured to provide a gate signal to a gate electrode of any one transistor from among the transistors of the sub-pixel circuit.

7. The display apparatus of claim 6, further comprising a gate line arranged in the display area and electrically connected to the gate electrode of the any one transistor of the sub-pixel circuit, wherein the conductive line includes a same material as the gate line.

8. The display apparatus of claim 7, wherein the gate line is on a different layer from the gate electrode of the any one transistor of the sub-pixel circuit.

9. The display apparatus of claim 6, wherein the sub-pixel circuit further includes a storage capacitor including a lower electrode and an upper electrode overlapping each other, and the conductive line includes a same material as the upper electrode of the storage capacitor.

10. A display apparatus comprising:

a light-emitting diode in a display area;

a sub-pixel circuit electrically connected to the light-emitting diode and including a silicon-based transistor, an oxide-based transistor, and a storage capacitor;

a gate driver in a non-display area around the display area, the gate driver including a plurality of stages;

a conductive line in the non-display area and elongated along an extension direction;

an insulating layer above the conductive line;

a connection line above the insulating layer and electrically connecting the conductive line with a transistor included in a first stage from among the plurality of stages;

a gate insulating layer interposed between a semiconductor layer of the transistor and a gate electrode layer of the transistor; and an interlayer insulating layer interposed between the gate insulating layer and the insulating layer, wherein, in a plan view, the connection line is elongated along the extension direction with a first portion of the connection line entirely overlapping the conductive line along the extension direction, in a cross-sectional view, the conductive line is interposed between the interlayer insulating layer and the insulating layer.

11. The display apparatus of claim 10, wherein the first stage is configured to provide a gate signal to the silicon-based transistor or the oxide-based transistor of the sub-pixel circuit.

12. The display apparatus of claim 10, wherein the first portion of the connection line is electrically connected to the conductive line through a first contact hole passing through the insulating layer, and a second portion of the connection line is electrically connected to the transistor through a second contact hole passing through the insulating layer and the interlayer insulating layer.

13. The display apparatus of claim 12, wherein the second portion of the connection line directly contacts the semiconductor layer or the gate electrode layer through the second contact hole.

14. The display apparatus of claim 10, wherein the conductive line includes a same material as a gate line electrically connected to the silicon-based transistor or the oxide-based transistor of the sub-pixel circuit.

15. The display apparatus of claim 10, wherein the storage capacitor includes a lower electrode and an upper electrode overlapping each other, and the conductive line includes a same material as the upper electrode.

16. The display apparatus of claim 10, wherein the conductive line includes a first conductive part and a second conductive part spaced apart from each other in an extension direction of the conductive line, and the connection line is electrically connected to each of the first conductive part and the second conductive part.

* * * * *